United States Patent [19]

Gould

[11] Patent Number: 4,631,494
[45] Date of Patent: Dec. 23, 1986

[54] CONDUCTIVE HOUSING AND BIASING SYSTEM FOR MICROWAVE INTEGRATED CIRCUITS

[76] Inventor: Harry J. Gould, 1649 E. Hale, Mesa, Ariz. 85204

[21] Appl. No.: 633,104

[22] Filed: Jul. 20, 1984

[51] Int. Cl.<sup>4</sup> .............................................. H03F 3/60
[52] U.S. Cl. .................................... 330/286; 330/277; 333/246
[58] Field of Search ................. 330/277, 286, 287, 65, 330/66, 67, 68; 333/238, 246; 357/75

[56] References Cited

U.S. PATENT DOCUMENTS

| | | | |
|---|---|---|---|
| 2,812,501 | 11/1957 | Sommers | 333/95 |
| 4,093,925 | 6/1978 | Yokoyama | 330/277 |
| 4,129,897 | 12/1978 | Telewski et al. | 361/399 |
| 4,276,655 | 6/1981 | Kraemer et al. | 455/327 |
| 4,480,240 | 10/1984 | Gould | 333/246 |

Primary Examiner—Eugene R. LaRoche
Assistant Examiner—Steven J. Mottola
Attorney, Agent, or Firm—Joseph H. Roediger

[57] ABSTRACT

A processing system for microwave signals including a conductive housing having a waveguide probe for the input, a coaxial output connection and a section for receiving a microwave integrated circuit therein. The section contains two high impedance recesses therein, each of which is spaced a quarter-wavelength at microwave frequencies from the input and output portions of the integrated circuit. The high impedance recesses, reflected to the input and output sections, provide low impedance coupling therebetween for microwave signals. A dielectric member is interposed between the ground plane of the integrated circuit and the conductive housing to provide dc isolation therebetween and enable a single polarity voltage supply to establish the bias and operating voltages for the microwave integrated circuit.

14 Claims, 4 Drawing Figures

CONDUCTIVE HOUSING AND BIASING SYSTEM FOR MICROWAVE INTEGRATED CIRCUITS

BACKGROUND OF THE INVENTION

This invention relates to a processing system for microwave signals residing within a frequency band of interest wherein a microwave integrated circuit is mounted in a conductive housing and the housing is an integral part of the system. The conductive housing is provided with means to couple the input and output regions of the integrated circuit to the housing for microwave signals within the frequency band while providing dc isolation therebetween for the operating voltages of the active elements of the integrated circuit.

The increasing consumer acceptance and market for systems which receive microwave signals carrying television information from satellites in geosynchronous orbits can be noted by observing the ever increasing number of antennas throughout the country. A typical private receiving station includes a parabolic reflecting antenna which concentrates the received signal to a prime focus waveguide feed which serves as the input to the subsequent microwave processing systems.

The antenna concentrates the gathered signals within the 3.7 to 4.2 GHz band of interest with the centrally mounted waveguide input section assisting in this process. A conductive housing is located behind the waveguide input section and contains the processing systems for the received microwave signals. The first system is typically a low noise amplifier mounted in a conductive housing and contains a waveguide probe at its front end to couple the received signals into the processing systems. This initial amplifier system is normally provided with a coaxial output connection to subsequent processing systems which include the converter for lowering the frequency range to 70 MHz and the receiver for further signal processing prior to being fed to the home display equipment.

The first processing system, i.e., the low noise amplifier system, normally includes a conductive housing with a microwave integrated circuit fastened to a large area surface of an enclosed chamber. A number of different systems are presently in use, many containing an isolator or circulator interposed between the waveguide coupling probe and the integrated circuit for reducing the noise performance of the system due to reflections and standing-wave interactions. The output signal from the isolating section is supplied to the integrated amplifier circuit. The amplifier signal is then fed via coaxial connector to subsequent processing systems.

The operating voltage for the active elements of the microwave circuit is supplied through the coaxial cable which establishes a dc voltage difference between the conductive housing and the strip conductor network located on the top surface of the integrated circuit. In practice, the integrated circuit is attached to the chamber of the housing by threaded fasteners which ensure good electrical contact between the housing and the ground plane of the integrated circuit. The magnitude of the dc voltage supplied is determined by the voltage drops and line losses encountered before reaching the processing system. These voltage drops vary so that regulation is provided on the integrated circuit to insure a constant voltage supply. The regulated output voltage, for example +5 volts dc with respect to the ground plane and conductive housing, is then utilized by an integrated circuit mounted within the housing. A separate integrated circuit, e.g., an inverter, generates the negative bias supply voltages for the active devices in the processing system.

The microwave integrated circuit, as the term is used, is a hybrid form of integrated circuit with individual field effect transistors mounted on a dielectric substrate having a strip conductor network on one surface thereof and a ground plane on the opposing surface. The regulator and inverter circuits along with discrete passive elements used therewith are mounted either on the segment of microstrip transmission line as individual components or on a separate board mounted within a separate cavity remote from the microstrip segment. The additional assembly steps required for the mounting of the inverter integrated circuit and the cost of these additional components add to system costs and complexity but have heretofore been needed to establish negative voltage levels for the type of microwave transistors favored for use in these systems.

The field effect transistor (FET) presently utilized for microwave signals is an N-channel device operated in the depletion mode. This type of operation requires a negative gate-to-source bias. The favored material for microwave FETs is gallium-arsenide and due to the characteristics of the material and the devices, self-bias techniques employing resistors and capacitances in the input signal path which are useful at lower frequencies and stronger signals cannot be employed without increasing the system noise figure to unacceptable levels. Consequently, the additional components have heretofore been required for the microwave integrated circuit in order to establish negative bias voltages.

Accordingly, the present invention is directed to the provision of a system for processing microwave signals wherein the ground plane of the microwave integrated circuit is electrically coupled to the conductive a housing for signals within the bands of interest but isolated therefrom for bias voltage purposes. Consequently, the ground plane voltage of the integrated circuit can be determined independently of the housing voltage, and a negative gate-source bias voltage established without requiring the addition of an inverter circuit to the system.

The elimination of the integrated circuit inverter and the supporting strip conductor network reduces the complexity and cost of the microwave integrated circuit thereby providing a simplified, less expensive system for processing microwave signals.

SUMMARY OF THE INVENTION

The invention is directed to a system for processing microwave signals residing within a frequency band of interest. The system includes a segment of transmission line of the type having a conductive ground plane and a first strip conductor with a dielectric layer therebetween. The segment provides the base for a microwave integrated circuit having an active device as an element. The active device has source, drain and gate electrodes with the signal to be processed being applied at the gate electrode.

The system is provided with input and output means adapted for connection to external circuit means. The input and output means are electrically coupled to spaced regions of the strip conductor of the transmission line segment in accordance with the particular type of circuit design employed. Bias circuit means is coupled to the strip conductor for establishing the operating voltages for the active devices in the processing system.

A conductive housing adapted to contain the transmission line segment is provided. The housing includes receiving means for the placement of the segment therein along with dielectric means interposed between the transmission line segment and the adjacent portion of the conductive housing. The dielectric means electrically isolates the ground plane from the housing.

The electrical isolation between the ground plane of the transmission line provided by the dielectric means therebetween is effective for dc voltages and a dc voltage difference can be maintained therebetween. In addition, the receiving means portion of the conductive housing is provided with impedance means formed therein which are spaced from the input and output means so as to appear as an electrical connection therebetween for microwave signals residing within the frequency band of interest. Consequently, the ground plane and conductive housing appear interconnected as far as signal processing is concerned. The microwave signal applied between the input means and the housing is not significantly altered when it appears as the signal between the strip conductor and the ground plane of the microwave integrated circuit. This is particularly important when dealing with the low signal strengths received under differing conditions from satellite based transmitters.

By electrically isolating the ground plane of the microwave integrated circuit from the housing for the dc voltages, the voltage level of the ground plane can be set by the use of passive components mounted on the transmission line without interfering with the processing of the microwave signals. As a result, bias circuits can utilize a single polarity voltage supply to establish the voltage levels for the active elements in the integrated circuit thereby eliminating the need for inverter circuits and additional strip conductor routing of voltage across the upper surface of the microwave integrated circuit.

Further features and advantages of the invention become more readily apparent from the following description of the preferred embodiment thereof when viewed in conjunction with the accompanying drawings.

DESCRIPTION OF THE PREFERRED EMBODIMENT

Figure 1:
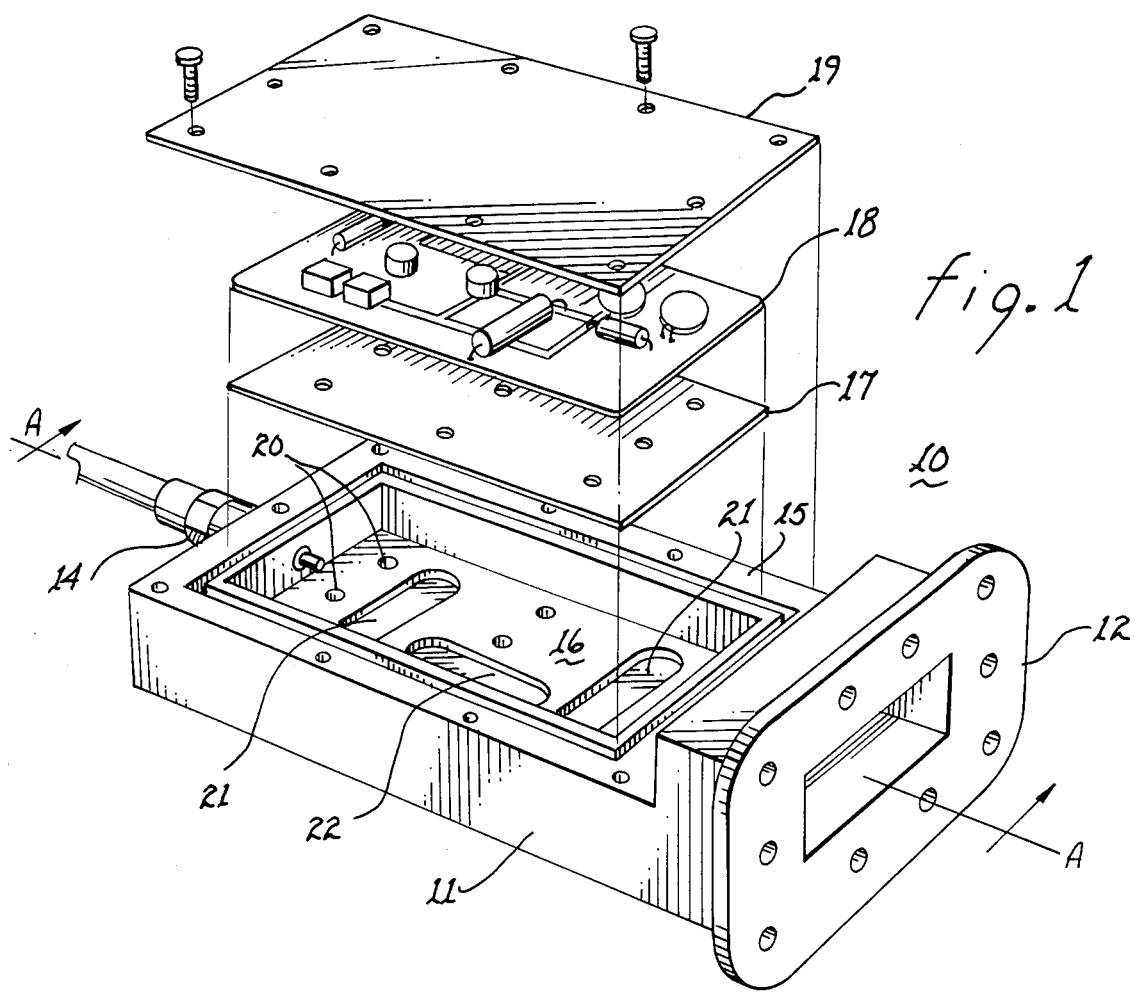
FIG. 1 is an exploded view in perspective of one embodiment of the invention.

Referring now to FIG. 1, the present invention is shown in an embodiment utilized for amplifying microwave signals received from a prior section of waveguide (not shown). The preferred embodiment of system 10 includes a conductive housing 11 having a flanged coupling 12 and a coaxial coupling 14 at the opposing ends thereof for connection to external components. As customary, the flanged coupling is provided with peripheral holes to permit fastening to an adjacent waveguide flange through which the microwave signal is propagating. In the embodiment shown, the microwave signal is the satellite signal received from a parabolic collector and resides within the 3.7 to 4.2 GHz frequency band. The amplifier utilizes gallium-arsenide field effect transistors for their low-noise performance and supplies the amplified signal to subsequent circuitry via coaxial cable attached to coaxial coupling 14. The coaxial coupling also is the power source for the system since a d.c. voltage is maintained between the inner and outer conductors of the coaxial cable. In practice, this voltage difference is within the range of 12 to 24 volts depending on line loss and other variables but is maintained well above the approximately 5 volts needed by the amplifier active devices. The microwave integrated circuits are customarily provided with a discrete regulator circuit that provides the regulated nominal output voltage. Prior processing systems have utilized discrete integrated circuits for converting the output dc voltage of the regulator into bipolar dc signals for use at the different electrodes of the active devices in the microwave integrated circuit.

As shown in FIG. 1, the end of the conductive housing 11 proximate to the flanged coupling 12 maintains the waveguide dimensions for a distance until joined with section 15 having a reduced vertical dimension. Section 15 contains a recessed region 16 for the placement of dielectric spacer 17 and the microwave integrated circuit 18 therein. The spacer 17 covers the bottom area of recessed region 16 and prevents contact between the bottom surface area of the integrated circuit and the conductive housing.

The term microwave integrated circuit is a generally accepted term, denoting a circuit containing a segment of transmission line with a strip conductor network and discrete components located on one surface of a dielectric substrate and a conductive ground plane formed on the opposing surface. The microwave integrated circuit is often referred to as a hybrid circuit since individual components are mounted therein to operate with both the bias and operating voltages as well as with the microwave signal being processed. The integrated circuit 18 is contained within the recess and a cover 19 is placed thereover to protect the strip conductor network and the discrete device connections from ambient conditions.

The dielectric spacer 17 and the substrate of integrated circuit 18 are provided with holes which are in alignment with threaded holes 20 in the bottom surface of region 16. Further, the bottom surface is provided with a pair of spaced transverse recesses 21 extending across the width of region 16 which provide certain electrical characteristics as will be later described. A longitudinal slot 22 is formed between the recesses 21 in order to accommodate any protuberance occurring on the ground plance of the microwave integrated circuit due to interconnections made between discrete components and the conductive ground plance. The central location or position and dimensions of the slot 22 do not influence the desired performance of the embodiment providing that it is positioned between the transverse recesses 21.

Figure 2:
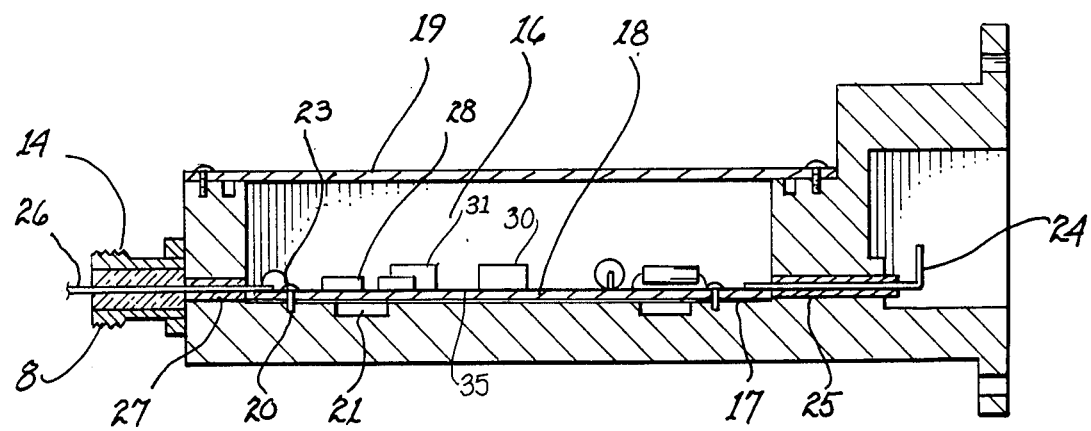
FIG. 2 is a side view of the embodiment of FIG. 1 taken along line A—A.

The constructional features of the preferred embodiment are further shown in the section view of FIG. 2 wherein the ground plane surface of microwave circuit 18 is spaced adjacent the bottom surface of recessed region 16 by the dielectric spacer 17. The circuit and the spacer are held in position by threaded fasteners 23 inserted into holes 20. The strip conductor network formed on the top surface of the integrated circuit contains input and output terminations located on opposing ends of the circuit. The input termination is connected to the center conductor of probe 24 which is spaced from the body of the conductive housing 11 by dielectric sleeve 25. The inner end of probe 24 is electrically connected to the strip conductor of the integrated circuit and supplies the microwave signal from the probe to the processing system.

The output termination of the integrated circuit located at the opposing end is connected to center 26 of coaxial coupling 14. The center conductor is electrically isolated from the conductive housing 11 by dielectric sleeve 27 while the outer conductor 28 is affixed directly to the housing. The processed microwave signal, which in this embodiment is amplified, is supplied to subsequent circuitry via a coaxial cable fastened to coupling 14. The cable also serves to provide the dc operating voltages needed by the components of the integrated circuit. The center conductor 26 is normally at +15 volts dc with respect to the conductive housing. This voltage is regulated downward by a device 28 mounted on the integrated circuit proximate to the connection between the center conductor of the coaxial coupling 14 and the strip conductor 35 shown in FIG. 2.

The transverse recesses formed in the base of region 16 each constitute a transmission line with the adjacent portion of the ground plane and the dielectric therebetween. By providing a deep recess, the distributed capacitance is small and the characteristic impedance of the transmission line is large at this point in the structure for microwave signals. However, each recess is located an odd number of quarter wavelengths, based on the frequency band of interest, in distance from the input and output regions of the integrated circuit. As a result, the impedance due to the recesses appears as a relatively low impedance to the microwave signals at the input and output regions and, thus, the ground plane and the conductive housing are electrically coupled for signals within the frequency band of interest. However, it is to be noted that the dc potential of the ground plane is not tied to the potential of the housing but can be established by other electrical connections therebetween on the integrated circuit. Typically, the ground plane is connected by series resistances, one of which extends through the dielectric substrate to the ground plane and then to the conductive housing via one of threaded fasteners 23. The voltages developed across the resistors are available for establishing the operating range of the transistors in the amplifier system.

Figure 4:
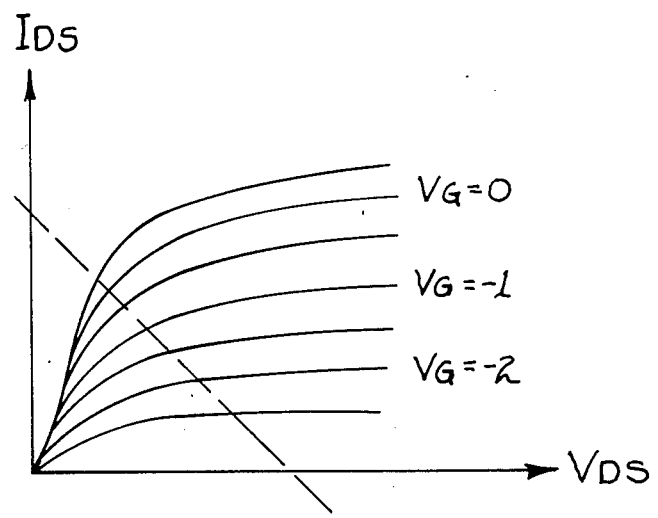
FIG. 4 is a series of curves showing the operating characteristics of a field-effect-transistor suitable for use in the preferred embodiment.

The goal for low noise performance in microwave amplifiers normally requires the use of N-channel field-effect devices operated with a negative gate voltage in respect to the source voltage. A typical set of operating characteristics is shown in FIG. 4 with a representative load line illustrated by way of example. The source electrode of the FET in microwave integrated circuits is normally connected to the ground plane of the circuit. Thus, the gate bias voltage must be able to be made negative with respect to the source for the desired operation. By permitting the ground plane to float at dc potential levels, the bias signals for negative gate potential can be derived from the resistors provided therebetween since the ground plane will be at a lower dc potential than the conductive housing. Importantly, the effect of the impedance means located in the recessed region 16 of the housing does not result in any significant difference for the microwave signals being processed.

Figure 3:
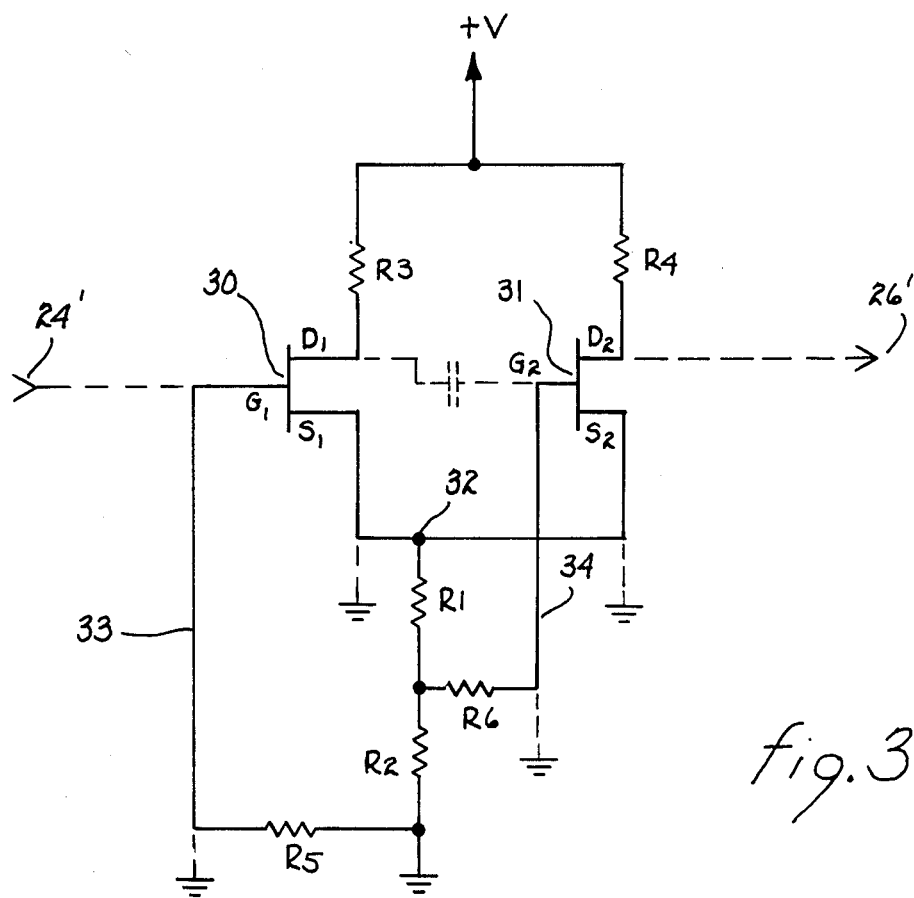
FIG. 3 is a schematic drawing of a microwave amplifier circuit mounted in the conductive housing of the embodiment of FIG. 1.

The electrical schematic of FIG. 3 illustrates the different circuits for the microwave signal (rf) supplied to the gate electrode $G_1$ of the first FET in a two stage amplifier and for the supply of the dc operating voltage levels therein. The signal to be amplified is present at terminal $24^1$ corresponding to the waveguide probe in FIG. 2 and supplied to the gate electrode of FET 30. The output of the FET 30 is supplied to the gate electrode of FET 31 as shown by the dashed line of connection in FIG. 3. The output signal is provided to the terminal $26^1$ corresponding to the coaxial center conductor shown in FIG. 2. The source electrodes are coupled for microwave signals to the conductive housing of the system (i.e., the dashed lines to ground) and are coupled together at terminal 32 corresponding to the ground plane of the microwave integrated circuit for the establishment of the dc voltage levels in the circuit.

The regulated supply voltage +V is applied across the combination of a drain load resistor $R_3$, $R_4$, the corresponding active device and the first resistance means of resistors $R_1$ and $R_2$. The first resistance means is coupled between the ground plane at terminal 32 and the system ground of the conductive housing. In operation, the magnitude of resistors $R_1$ and $R_2$ are selected to provide the bias voltage levels needed for the FET devices employed in the amplifier circuit. A second resistor $R_5$ couples the gate electrode of FET 30 to the system ground through a second strip conductor 33 which is a quarter of wavelength in length at the microwave frequency band so as to appear as an open circuit at the gate for microwave signals. Also, a third resistor $R_6$ couples the gate electrode of FET 31 to system ground through a third strip conductor also a quarter wavelength in length. Both of the quarter wavelength strip conductors 33 and 34 are terminated with a low impedance (for example a large area resistance or flag) at microwave frequencies, shown as dashed couplings to ground at terminals 36 and 37.

For one system tested and successfully operated in the frequency band of 3.7 to 4.2 GHz. The +V regulated voltage is 5 v and the voltage level at terminal 32, the interconnection of the source electrodes of the two FET devices, was +1 v nominal. The gate electrode $G_1$ of FET 30 was maintained at the dc level of the conductive housing, i.e., system ground or 0 volts reference, while the gate electrode of FET 31 was maintained at +0.5 v. Thus, the gate-source voltage for each FET in the system is negative thereby permitting the N-channel FET's to operate the depletion mode in the absence of an operating voltage level that it is negative with respect to the conductive housing. Also, the drain load resistor $R_3$ is larger than the resistor $R_4$ so that the drain-source voltage of FET 30 is 3.5 v while the drain-source voltage of FET 31 was about 4.5 v.

It is to be noted that the above discussion has referred to a gate-source voltage Vgs for FET 30 which is larger than the gate-source voltage Vgs for FET 31 in order to establish the appropriate operating bias for the described embodiment. Provision for interchanging the voltage tap points for resistors $R_5$ and $R_6$ can be provided in order to reverse the relative magnitudes of Vgs for each FET in accordance with the operating specification of the individual FET devices utilized.

While the foregoing description has referred to a specific embodiment of the invention, it is recognized that variations and modifications may be made therein without departing from the scope of the invention as claimed. This application is related to my pending U.S. application Ser. No. 432,089, filed on Sept. 30, 1982 and entitled "Apparatus for Separating RF Ground Plane from Housing".

I claim:

1. A system for processing microwave signals residing within a frequency band of interest, said system comprising:
   (a) a segment of transmission line including a conductive ground plane, a first strip conductor and a dielectric substrate therebetween;
   (b) a processing circuit including at least one transistor located on said segment, said transistor having source, drain and gate electrodes;
   (c) input and output means electrically coupled to spaced regions of the strip conductor and adapted for connection to external circuit means;
   (d) a conductive housing including receiving means for placement of said segment of transmission line therein;
   (e) means for applying a supply voltage between said conductive housing and said strip conductor;
   (f) dielectric means interposed between said segment and said receiving means whereby said ground plane is spaced from the conductive housing and the strip conductor;
   (g) impedance means formed in the receiving means of said conductive housing, said impedance means electrically coupling said conductive housing to said ground plane at frequencies within the band of interest; and
   (h) bias circuit means coupled to said strip conductor and said processing circuit for establishing the operating voltages therefor.

2. The system of claim 1 wherein the gate electrode of the transistor of said circuit is coupled to said strip conductor and said source electrode thereof is coupled to said ground plane.

3. The system of claim 2 further comprising first resistance means coupled between the ground plane and the conductive housing to establish the potential of said ground plane.

4. The system of claim 3 wherein said processing circuit includes first and second transistors each having source, drain and gate electrodes, said first resistance means being coupled between said ground plane and the conductive housing, the gate electrodes of said transistors being connected to said first resistance means to establish the bias voltages therefor.

5. The system of claim 3 further comprising a second resistance means coupled between the conductive housing and the gate electrode of said transistor and a strip conductor coupled between said second resistance means and said gate electrode, said second strip conductor having a length of substantially a quarter wave length for frequencies within the band of interest and a low impedance termination therefor.

6. The system of claim 5 wherein the input means is coupled to the gate electrode of said transistor.

7. The system of claim 6 wherein said input means further comprises a waveguide probe for receiving the input signal.

8. The system of claim 6 further comprising a voltage regulation circuit coupled between the second electrode of said transistor and the means for applying a supply voltage between the housing and the strip conductor.

9. The system of claim 8 wherein said circuit includes first and second transistors each having source, drain and gate electrodes, the source electrodes of said transistors being connected to said ground plane, the drain electrode of said first transistor being coupled to the electrode of said second transistor for signals within the frequency band, the gate electrode of said second transistor being coupled through a third resistance means to said ground plane and further including means for coupling the drain electrodes to an operating voltage source.

10. The system of claim 9 comprising a third strip conductor coupled between said third resistance means and said gate electrode, said third strip conductor having a length of substantially a quarter wavelength for frequencies within the band of interest and a low impedance termination therefor.

11. The system of claim 10 wherein said impedance means formed in the receiving surface of said conductive housing are spaced from said input and output means by a distance of n quarter-wavelengths at a frequency within the band of interest where n is an odd integer, said impedance means electrically coupling said conductive housing to said ground plane at frequencies within the band of interest.

12. The system of claim 11 wherein said impedmeans comprise a high impedance termination formed in the receiving surface.

13. The system of claim 12 wherein said input and output means are located at opposing ends of the transmission line segment and said impedance means comprises recesses in said receiving surface spaced from the input and output means.

14. The system of claim 13 wherein the recesses of said impedance means transversally extend in the receiving surface to the opposing edges of the ground plane of said transmission line segment.